US007865864B2

(12) United States Patent  (10) Patent No.: US 7,865,864 B2
Banerjee et al.  (45) Date of Patent: Jan. 4, 2011

(54) ELECTRICALLY DRIVEN OPTICAL PROXIMITY CORRECTION

(75) Inventors: Shayak Banerjee, Austin, TX (US); James A. Culp, Newburgh, NY (US); Praveen Elakkumanan, Hopewell Junction, NY (US); Lars W. Liebmann, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 407 days.

(21) Appl. No.: 12/024,188

(22) Filed: Feb. 1, 2008

(65) Prior Publication Data

US 2009/0199151 A1  Aug. 6, 2009

(51) Int. Cl.
    *G06F 17/50* (2006.01)
(52) U.S. Cl. .......................................... 716/20; 716/19
(58) Field of Classification Search .................. 716/2, 716/5, 20, 19
    See application file for complete search history.

(56) References Cited

U.S. PATENT DOCUMENTS

| 6,735,742 | B2 * | 5/2004 | Hatsch et al. | 716/2 |
| 7,543,256 | B1 * | 6/2009 | Lukanc et al. | 716/5 |
| 2003/0229868 | A1 * | 12/2003 | White et al. | 716/5 |

OTHER PUBLICATIONS

Koike, K. et al, "Optimization of layout design and OPC using transistor properties," Proc. SPIE, vol. 6283, 62830P, May 2006.
Gupta, P. et al., "Performance Driven OPC for Mask Cost Reduction," Proc. of Sixth ISQED, Mar. 2005.
Yang, J. et al., "Advanced Timing Analysis Based on PostOPC Extraction of Critical Dimensions," Proc. 42nd Design Automation Conference, 2005, pp. 359-364.
Cao, K. et al., "Standard Cell Characterization Considering Lithography Induced Variations," Proc. 43rd Design Automation Conference, 2006, pp. 801-804.
Poppe, W. J. et al., "From Poly Line to Transistor: Building BSIM Models for Non-Rectangular Transistors," Proc SPIE, 2006, vol. 6156, pp. 235-243.
Gupta, P. et al., "Modeling on Non-Uniform Device Geometries for Post-Lithography Circuit Analysis," Proc. SPIE, 2006, vol. 6156, pp. 285-294.
Cobb, N. et al., "Mathematical and CAD Framework for Proximity Correction," Proc. SPIE, Optical Microlithography IX, vol. 2726, Jun. 1996, pp. 208-222.
Choi, S.-H et al., "MEEF-Based Correction to achieve OPC convergence of low-k1 lithography with strong OAI," Proc. SPIE, 2006, vol. 6154, 61540P.

\* cited by examiner

*Primary Examiner*—Stacy A Whitmore
*Assistant Examiner*—Magid Y Dimyan
(74) *Attorney, Agent, or Firm*—Yuanmin Cai; Hoffman Warnick LLC (57) ABSTRACT

An approach that provides electrically driven optical proximity correction is described. In one embodiment, there is a method for performing an electrically driven optical proximity correction. In this embodiment, an integrated circuit mask layout representative of a plurality of layered shapes each defined by features and edges is received. A lithography simulation is run on the mask layout. An electrical characteristic is extracted from the output of the lithography simulation for each layer of the mask layout. A determination as to whether the extracted electrical characteristic is in conformance with a target electrical characteristic is made. Edges of the plurality of layered shapes in the mask layout are adjusted in response to determining that the extracted electrical characteristic for a layer in the mask layout fails to conform with the target electrical characteristic.

14 Claims, 4 Drawing Sheets

ELECTRICALLY DRIVEN OPTICAL PROXIMITY CORRECTION

BACKGROUND

This disclosure relates generally to design for manufacturing, and more specifically to design for manufacturing of integrated circuits using an electrically driven optical proximity correction (EDOPC).

An optical proximity correction (OPC) is typically used in the design of integrated circuits to correct for discrepancies that exist between patterns on an initial mask layout and how these patterns print on a semiconductor wafer using optical lithography. A typical OPC operation involves fragmentation and subsequent distortion of mask features to ensure that structures printed on the wafer closely resemble target shapes embodied in the initial mask layout. In particular, upon receiving the initial mask layout, a typical OPC operation begins by generating assist features and sizing features up for etch bias. This is followed by fragmentation to generate edges which can be subsequently moved to generate the target shapes. A lithography simulation supported by optical and resist models is run to help determine the resist shapes. Edge placement errors between printed shapes and target shape features embodied in the initial mask layout are determined at a number of sites and used to determine the amount of edge movements of the shapes in the mask layout that are needed to reduce these errors. Essentially, edge placement error (EPE) is a metric of how much disturbance there is between the patterns in the initial mask layout and the output of the simulation. If there is a large amount of disturbance, then the OPC moves edges and shapes in initial mask layout appropriately to control the amount of EPE. Once the OPC has determined that the EPEs are in control, then an output mask layout is generated and transferred to a mask house for mask preparation.

There are several shortcomings associated with using this OPC methodology. One shortcoming is that this OPC methodology concentrates on maintaining the edges of the shapes by minimizing EPEs to obtain pattern fidelity between the initial mask layout and lithography simulation output (i.e., the layout that will be printed on the wafer), but this does not necessarily guarantee that electric characteristics of the shapes will be obtained. For example, current through a transistor is inversely proportional to gate length, whereas minimization of EPE leads to a linear control over gate length, suggesting that a non-rectangular shape may actually exhibit more accurate electrical behavior. This inability to guarantee ideal electrical behavior characteristics affects parametric yield during manufacturing. Another shortcoming is that a large amount of computational effort is spent in correcting for corners and other regions which are electrically non-critical and may be only be important from a catastrophic yield point of view (e.g., opens, shorts, etc.).

SUMMARY

In one embodiment, there is a method for performing an electrically driven optical proximity correction. In this embodiment, the method comprises: receiving an integrated circuit mask layout representative of a plurality of layered shapes each defined by features and edges; running a lithography simulation on the mask layout; extracting an electrical characteristic from the output of the lithography simulation for each layer of the mask layout; determining whether the extracted electrical characteristic is in conformance with a target electrical characteristic; and adjusting edges of the plurality of layered shapes in the mask layout in response to determining that the extracted electrical characteristic for a layer in the integrated circuit mask layout fails to conform with the target electrical characteristic.

In a second embodiment, there is a computer system for performing an electrically driven optical proximity correction. In this computer system there is at least one processing unit memory operably associated with the at least one processing unit. An integrated circuit mask generation module is storable in memory and executable by the at least one processing unit. The integrated circuit mask generation module comprises an input component configured to receive an initial mask layout containing a plurality of layered shapes each defined by features and edges. A lithography simulation component is configured to run a simulation on the initial mask layout. An electrically driven optical proximity correction component is configured to correct for differences between the initial mask layout and the simulated mask layout. The electrically driven optical proximity correction component comprises an electrical characteristic extraction component configured to extract an electrical characteristic for each layer from the simulated mask layout. An electrical characteristic comparison component is configured to determine whether the extracted electrical characteristic is in conformance with a target electrical characteristic. An edge adjustment component is configured to adjust edges of the plurality of layered shapes in the initial mask layout in response to determining that the extracted electrical characteristic for a layer fails to conform with the target electrical characteristic.

In a third embodiment, there is a computer-readable medium storing computer instructions, which when executed, enables a computer system to perform an electrically driven optical proximity correction. The computer instructions comprise: receiving an integrated circuit mask layout representative of a plurality of layered shapes each defined by features and edges; running a lithography simulation on the mask layout; extracting an electrical characteristic from the output of the lithography simulation for each layer of the mask layout; determining whether the extracted electrical characteristic is in conformance with a target electrical characteristic; and adjusting edges of the plurality of layered shapes in the mask layout in response to determining that the extracted electrical characteristic for a layer in the integrated circuit mask layout fails to conform with the target electrical characteristic.

DETAILED DESCRIPTION

Embodiments of this disclosure are directed to an electrically driven OPC (EDOPC) that guarantees the electric characteristics of the shapes in the initial mask layout in addition to ensuring pattern fidelity between the initial mask layout and lithography simulation output. Instead of pushing manufacturing information upstream as done in conventional OPC techniques, the EDOPC in this disclosure pushes design information downstream such as criticality of cell blocks, enabling the closing of an otherwise open design for a manufacturing loop. In particular, the EDOPC methodology described herein replaces the edge placement error (EPE) calculation with an electrical characteristic extraction step. Note that EPE is still used for ensuring pattern fidelity (e.g., to prevent electrical shorts and open circuits). Other changes between the EDOPC and the conventional OPC include replacing the EPE based edge movement by a power or performance based edge movement step. Also, the decision on the number of OPC iterations to perform (to obtain a minimized EPE) is decided in the EDOPC by error in the power or performance determination. Basically, this EDOPC methodology uses design intent as embodied in the design information as an objective for the OPC with a view to moving only certain critical edges to minimize the difference in actual and target electrical behavior. In addition, this EDOPC approach has the added improvement of lowering mask complexity over the conventional OPC approach since not all features on a mask are electrically critical. Therefore, the EDOPC allows one to concentrate OPC computational efforts on electrically critical regions.

Figure 1:
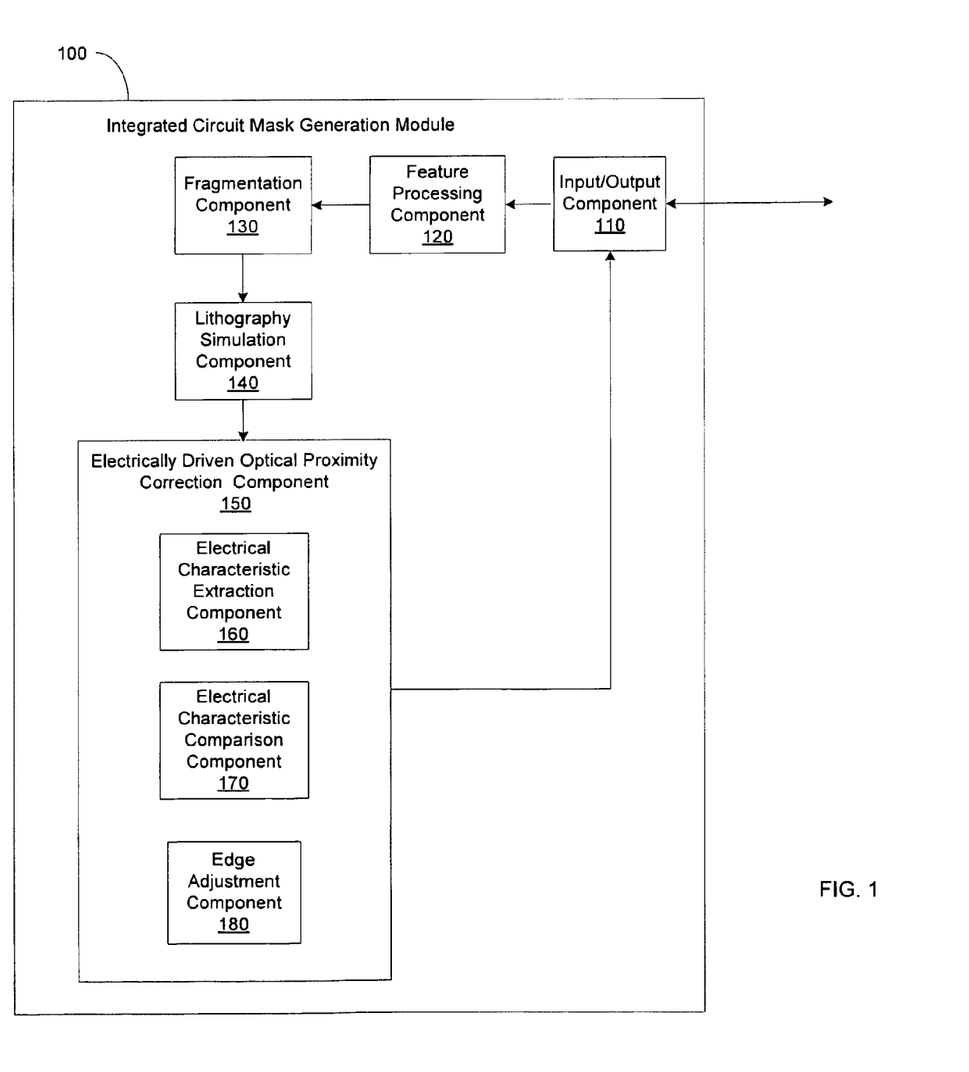
FIG. 1 is a schematic block diagram of an integrated circuit mask generation module that provides electrically driven optical proximity correction (EDOPC) according to one embodiment of the disclosure.

FIG. 1 is a schematic block diagram of an integrated circuit mask generation module 100 that provides EDOPC according to one embodiment of the disclosure. The integrated circuit mask generation module 100 comprises an input/output component 110 configured to receive input and output. In particular, the input/output component 110 is configured to receive an integrated circuit mask layout representative of a plurality of layered shapes each defined by features and edges as an input. A typical mask layout includes a polysilicon layer, contact layer, metal layer, active layer (diffusion layer) and via layer, each having their own shapes defined by features and edges. After several processing actions have been performed on the mask layout which are explained below, the input/output component 110 is configured to output the processed mask layout to a mask house for mask preparation.

A feature processing component 120 receives the mask layout from the input/output component 110 and is configured to perform pre-processing of the features in the layout. In particular, the feature processing component 120 generates assist features and sizes features up for etch bias. As is well-known to skilled artisans, generating assist features includes reticle enhancement techniques such as shape generation around the actual drawn shapes for improving the depth of focus of light to help in the printing, while generating size features includes adding pre calibrated biases on the drawn shapes for printing, etch and other process steps.

A fragmentation component 130 performs a fragmentation on the layered shapes in the mask layout. Generally, the fragmentation component 130 will take edges of the layered shapes and fragment them into small strips (e.g., 10 nm to 15 nm). The fragmentation of the edges enhances lithographic simulation which is performed after fragmentation and makes it easier for a comparison of features between the output of the simulation and the initial mask layout. Note that the type of fragmentation performed will depend on the layer in the layout that is processed and the technology that is embodied in the layout.

A lithographic simulation component 140 runs a simulation on the mask layout after fragmentation. A lithography simulation simulates how the layered shapes and their features as set forth in the initial mask layout will look on an actual wafer. More specifically, the lithography simulation lets integrated circuit designers know whether photoresist equipment can accurately print their integrated circuit layouts. A typical lithography simulation will draw on a database that characterizes equipment, materials, and processes to simulate and derive the manufacturing process for a specific layout, with the output being a simulation of the layout as it would print out on a wafer.

An EDOPC component 150 is configured to correct for differences between the initial mask layout and the simulated mask layout. In addition to ensuring pattern fidelity between the initial mask layout and the lithography simulation output which is the typical function of a conventional OPC, the EDOPC component 150 guarantees the electric characteristics of the shapes in the initial mask layout by moving only certain critical edges that will minimize the difference in actual and target electrical characteristic behavior.

As shown in FIG. 1, the EDOPC component 150 includes an electrical characteristic extraction component 160 configured to extract an electrical characteristic for each layer from the simulated mask layout. The electrical characteristic extracted from each layer is dependent on the layer (i.e., polysilicon layer, contact layer, metal layer, active layer, and via layer) in the mask layout. In one embodiment, the extracted electrical characteristic comprises on/off current for a polysilicon layer, resistance for a contact layer, resistance and capacitance for a metal layer, current for an active layer and resistance for a via layer. Those skilled in the art will recognize that other electrical characteristics can be extracted in place of, in addition to, or in combinations that are different than above.

Typically these electrical characteristics can be extracted in a variety ways. Generally, the electrical characteristics are extracted by studying the physical mechanisms behind the electrical behavior of a particular layer and deriving strategies to extract the electrical information from the simulated contour images of the drawn shapes. Below is one example of how current is extracted for a polysilicon layer.

The EDOPC component 150 further includes an electrical characteristic comparison component 170 that is configured to determine whether the extracted electrical characteristic is in conformance with a target electrical characteristic as set forth in the initial mask layout. In particular, the electrical characteristic comparison component 170 determines whether the extracted electrical characteristic is in conformance with the target electrical characteristic by ascertaining whether a certain electrical characteristic is within specification. In one embodiment, the certain electrical characteristic is a power and/or performance calculation. A power or performance calculation is performed by using well-known formulations. After this calculation has been made, it is determined whether power and/or performance are within design specification. Those skilled in the art will recognize that other characteristics can be used to ascertain whether an extracted electrical characteristic is in conformance with the target electrical characteristic such as resistance, capacitance, on current drive strengths or leakage currents. If the electrical characteristic calculation is within specification, then the mask layout is sent to the input/output component 110 and transferred to a mask house. On the other hand, if the electrical characteristic is not within specification then edge adjustments are made until electric fidelity has been preserved (i.e., the electrical characteristic is within design specification).

An edge adjustment component 180 is configured to adjust edges of the layered shapes in the mask layout in response to determining that the extracted electrical characteristic for a layer fails to conform with the target electrical characteristic.

In particular, the edge adjustment component 180 adjusts the edges of the shapes in the layers of the mask layout as a function of the difference between the extracted electrical characteristic and the target electrical characteristic. In one embodiment, the edge adjustment component 180 adjusts the edges as a function of the difference with the power or performance specification. Generally, the edges are moved such that the pattern fidelity is maintained and at the same time the electrical characteristic of the shapes is used as an optimization constraint. This may involve moving edges in such a way that the current electrical characteristic move towards the target characteristic using the basic equations governing the geometric and electrical relationships of the shapes (or layer) under consideration. In addition, the edge adjustment component 180 adjusts the edges as a function of EPEs noted between the output of the lithography simulation and the integrated circuit mask layout. The EPEs are generated by using conventional OPC techniques. Once the adjustment results in the electrical characteristic being within specification, then the mask layout is sent to the input/output component 110 and transferred to a mask house. Below is an example of how edge adjustment is performed for a polysilicon layer using electrical characteristic differences and EPEs.

Figure 2:
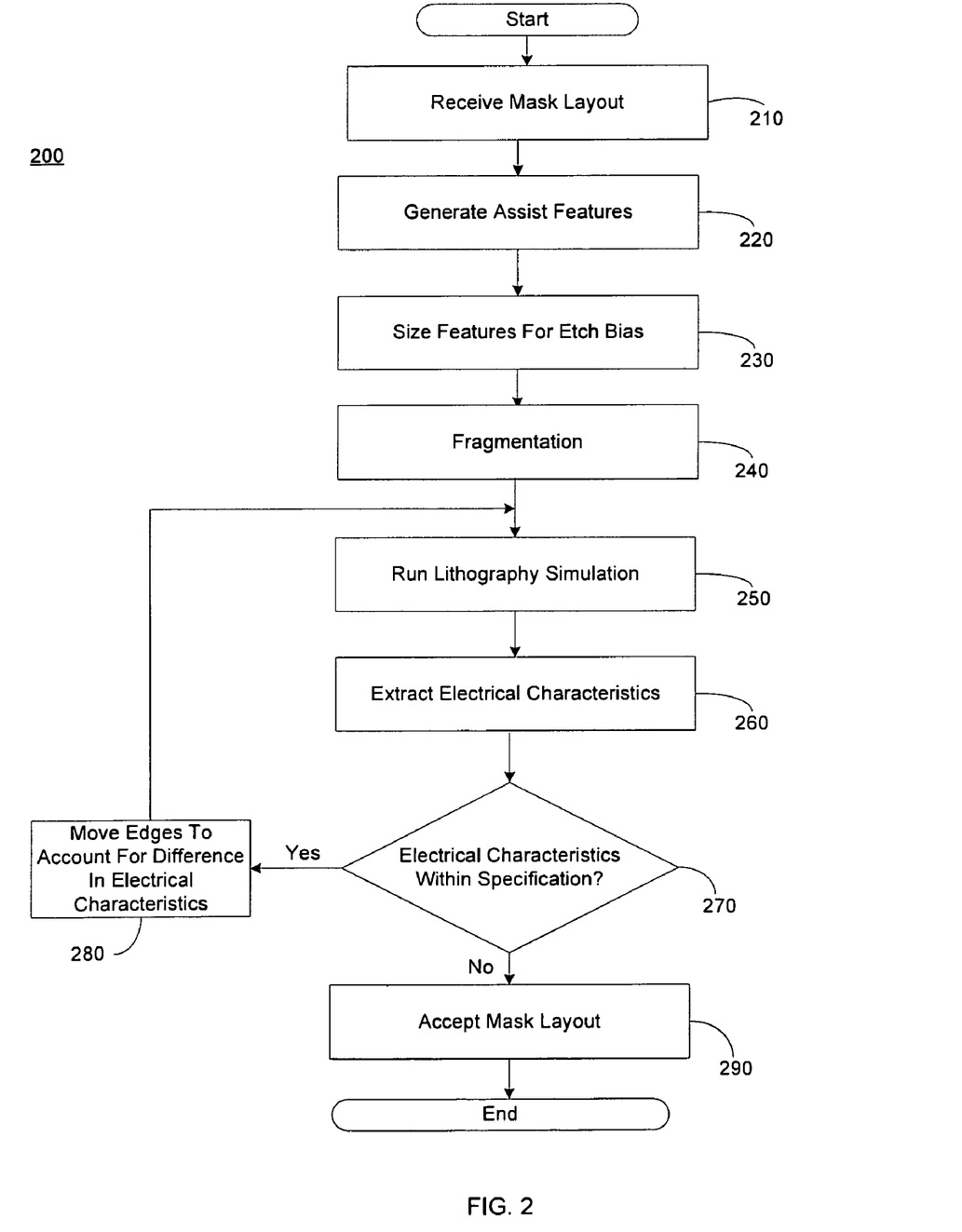
FIG. 2 is a flow diagram describing the process of providing EDOPC according to one embodiment of the disclosure.

FIG. 2 is a flow diagram describing the process 200 of providing EDOPC according to one embodiment of the disclosure. The process 200 begins at 210 where the input/output component 110 receives the initial mask layout. The feature processing component 120 receives the initial mask layout and generates assist features at 220 and sizes features up for etch bias at 230. Next, fragmentation occurs at 240 to ensure that structures printed on the wafer closely resemble target shapes embodied in the initial mask layout. As mentioned above, fragmentation involves taking edges of the layered shapes in the initial mask layout and fragmenting them into small strips so that comparison of features between the output of the simulation and the mask layout are made easier. After fragmentation, a lithography simulation is run at 250. The lithography simulation simulates how the layered shapes and their features as set forth in the initial mask layout will look on an actual wafer.

The electrical characteristic extraction component 160 of the EDOPC component 150 extracts an electrical characteristic for each layer from the simulated mask layout at 260. As mentioned above, the electrical characteristic extracted from each layer is dependent on the layer (i.e., polysilicon layer, contact layer, metal layer, active layer and via layer) in the mask layout. The electrical characteristic comparison component 170 in the EDOPC component 150 determines whether the extracted electrical characteristic is in conformance with a target electrical characteristic as set forth in the initial mask layout at 270. As mentioned above, in one embodiment, a power or performance calculation is performed for the electrical characteristic and compared with the design specification to determine how much adjustment of the shapes' edges are needed. The edge adjustment component 180 of the EDOPC component 150 is configured to adjust edges of the layered shapes in the mask layout at 280 until it is iteratively determined at 270 that the electrical characteristic associated with the particular shape in the layer of the mask layout is within conformance with the specification. Once the electrical characteristic (e.g., power or performance) calculation is within specification, then the mask layout is accepted at 290 and transferred to the mask house.

The foregoing flow chart shows some of the processing functions associated with providing EDOPC according to one embodiment of this disclosure. In this regard, each block represents a process act associated with performing these functions. It should also be noted that in some alternative implementations, the acts noted in the blocks may occur out of the order noted in the figure or, for example, may in fact be executed substantially concurrently or in the reverse order, depending upon the act involved. Also, one of ordinary skill in the art will recognize that additional blocks that describe the processing functions may be added.

Figure 3:
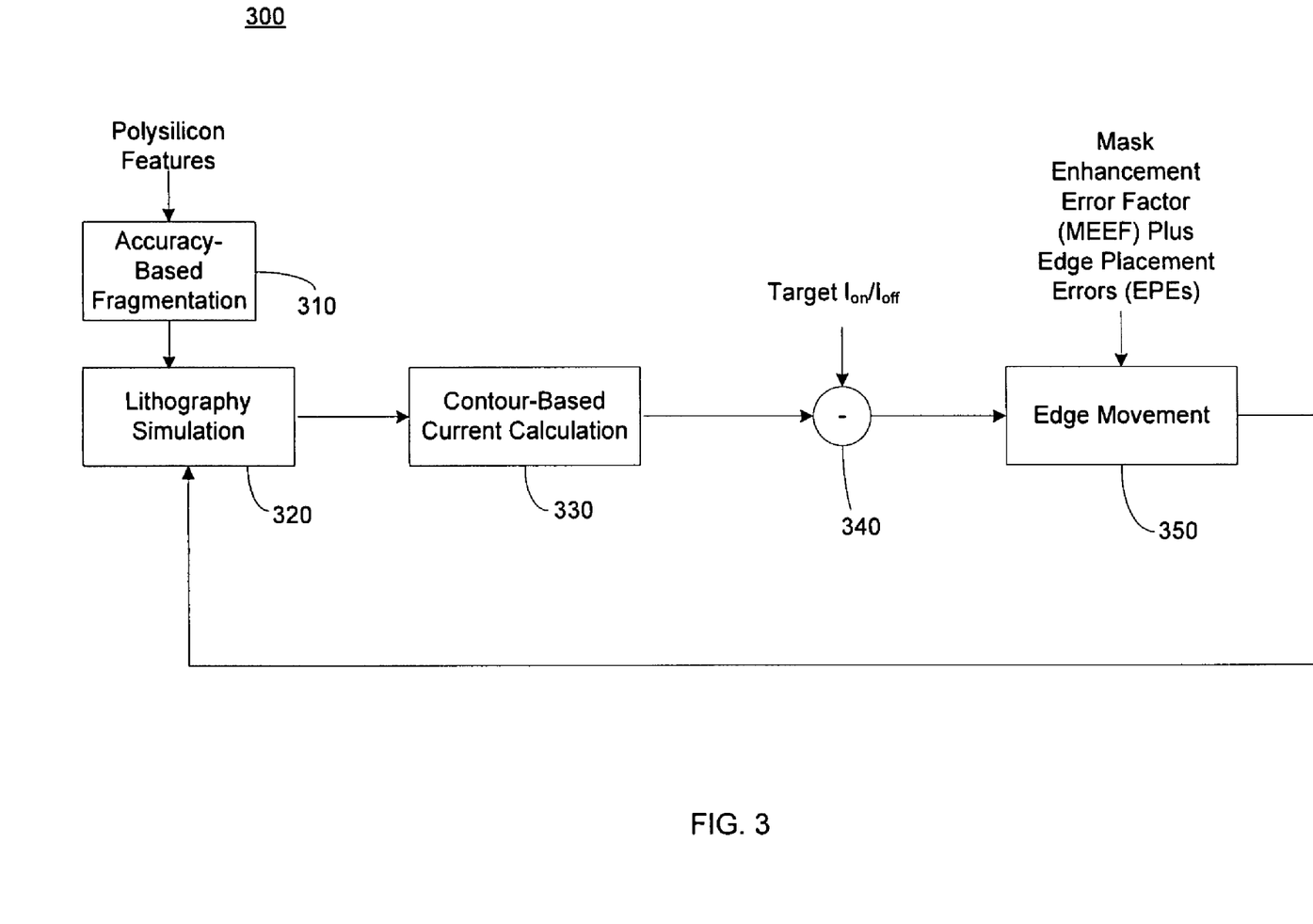
FIG. 3 is a schematic block diagram describing the process of providing EDOPC for a polysilicon layer within an integrated circuit mask layout according to one embodiment of the disclosure.

FIG. 3 is a schematic block diagram describing the process 300 of providing EDOPC for a polysilicon layer within an integrated circuit mask layout according to one embodiment of the disclosure. Although the description that follows is directed to providing EDOPC for a polysilicon layer, those skilled in the art will recognize that the teachings for this embodiment are applicable to other layers although there would be some differences in electrical characteristic extractions due to each individual layer. For example, instead of using current as the electrical characteristic as in the polysilicon layer, the other layers (e.g., contact layer, metal layer, active layer, and via layer) in the layout would extract different electrical characteristics. In one embodiment, the extracted electrical characteristic for a contact layer is resistance; the electrical characteristic for a metal layer is resistance and capacitance; the electrical characteristic for an active layer is current; and the electrical characteristic for a via layer is resistance.

In FIG. 3, accuracy-based fragmentation is performed at 310. Fragmentation as mentioned above, involves taking edges of the layered shapes in the initial mask layout and fragmenting them into small strips so that comparison of features between the output of the simulation and the mask layout are made easier. The selected fragment size is typically between 10 nm to 15 nm. The fragment size represents a tradeoff between mask complexity and accuracy. Smaller fragments allow better convergence in terms of current-matching accuracy but lead to highly complex masks, thus increasing mask cost. Small fragments also translate to higher computation time, so determining fragment size is based on accuracy of the current matching desired for the polysilicon layer.

After fragmentation, a lithography simulation is run at 320. As mentioned above, the lithography simulation simulates how the shapes and their features in the polysilicon layer of the layout will look on an actual wafer.

After the lithography simulation, electrical characteristics are extracted. In this embodiment, because the polysilicon layer is the layer of interest, a contour-based current calculation is performed at 330. In order to analyze the behavior of a polysilicon contour, the contour-based current calculation involves using a slicing technique. The slicing technique works on the fundamental principle that any transistor can be represented as a set of parallel transistors (called slices) provided the sum of the widths of the set equals the width of the transistor. Slices are assumed to be small enough to have constant gate length. As a result, this length is mapped to the slice current using a simulated program with integrated circuit emphasis (SPICE) generated mapping curve. Different curves are used for on and off currents. Slice currents are then summed to provide the total transistor current, which is then used to determine an effective gate length for the transistors.

As shown in FIG. 3, the calculated current is compared to the target on and off currents ($I_{on}$ and $I_{off}$) at 340 as set forth in the design of the initial mask layout. At 350, edge movement or adjustment of the edges of the shapes in the layer are moved until the target on and off currents ($I_{on}$ and $I_{off}$) are within conformance with the specification. In addition to preserving electric fidelity, the edge adjustment also adjusts the edges to ensure pattern fidelity by taking into account EPE and mask enhancement error factor (MEEF), both well-known OPC determinations that in this case are obtained from the difference between the initial mask layout and the simulation output.

In the embodiment shown in FIG. 3, the effective gate length is utilized to calculate the amount of resist bias to be applied to the gate in question (equation 1).

$$\Delta L_{resist} = L_{\mathit{eff}} - L_{t\,arg\,et} \quad (1)$$

The MEEF is then used to translate resist bias to the amount of bias on the mask (equation 2).

$$\Delta L_{mask} = \frac{\Delta L_{resist}}{MEEF}, \text{ where} \quad (2)$$

$$MEEF = \frac{\partial CD_{resist}}{\partial CD_{mask}} \quad (3)$$

For each pair of adjacent fragments, the EPE between the contour and target is computed both to the left and right ($EPE_{left}$ and $EPE_{right}$ respectively). The mask bias $\Delta L_{mask}$ is then split between the left and right fragments in the ratio of the EPEs as shown in equations 4 and 5.

$$\Delta L_{\mathit{left}} = \frac{EPE_{left} \Delta L_{mask}}{(EPE_{left} + EPE_{right})} \quad (4)$$

$$\Delta L_{\mathit{right}} = \frac{EPE_{right} \Delta L_{mask}}{(EPE_{left} + EPE_{right})} \quad (5)$$

Because the EDOPC performed at the edge movement block is essentially minimizing the difference in the on-currents between the target and resist contour, this can be formulated as an optimization problem. For example, given: a polysilicon mask with n transistors, for gate regions (previously defined as polysilicon overlapping active area):

$$\text{Minimize} \sum_{i=1}^{n} |I_{on,shape,i} - I_{on,target,i}|$$

$$\text{S.t.: } I_{leakage,i} \leq I_{nom,leakage,i} \forall i$$

For non-gate regions, ensure:
(i) Minimum overlap over contacts;
(ii) Minimum poly-to-poly spacing;
(iii) Minimum poly-to-contact spacing; and
(iv) Minimum poly width.

The objective function of this EDOPC optimization formulation aims at accuracy of timing by minimizing the difference in the on-currents between the target and resist contour. Leakage is used here as a constraint to ensure leakage-limited yield is not affected as a result of higher timing accuracy. For the non-critical polysilicon area, certain yield check constraints are enforced to avoid catastrophic yield issues such as open and short circuits. Once this objective function has been minimized, then the mask layout for the polysilicon layer is considered ready to be used for manufacturing.

Figure 4:
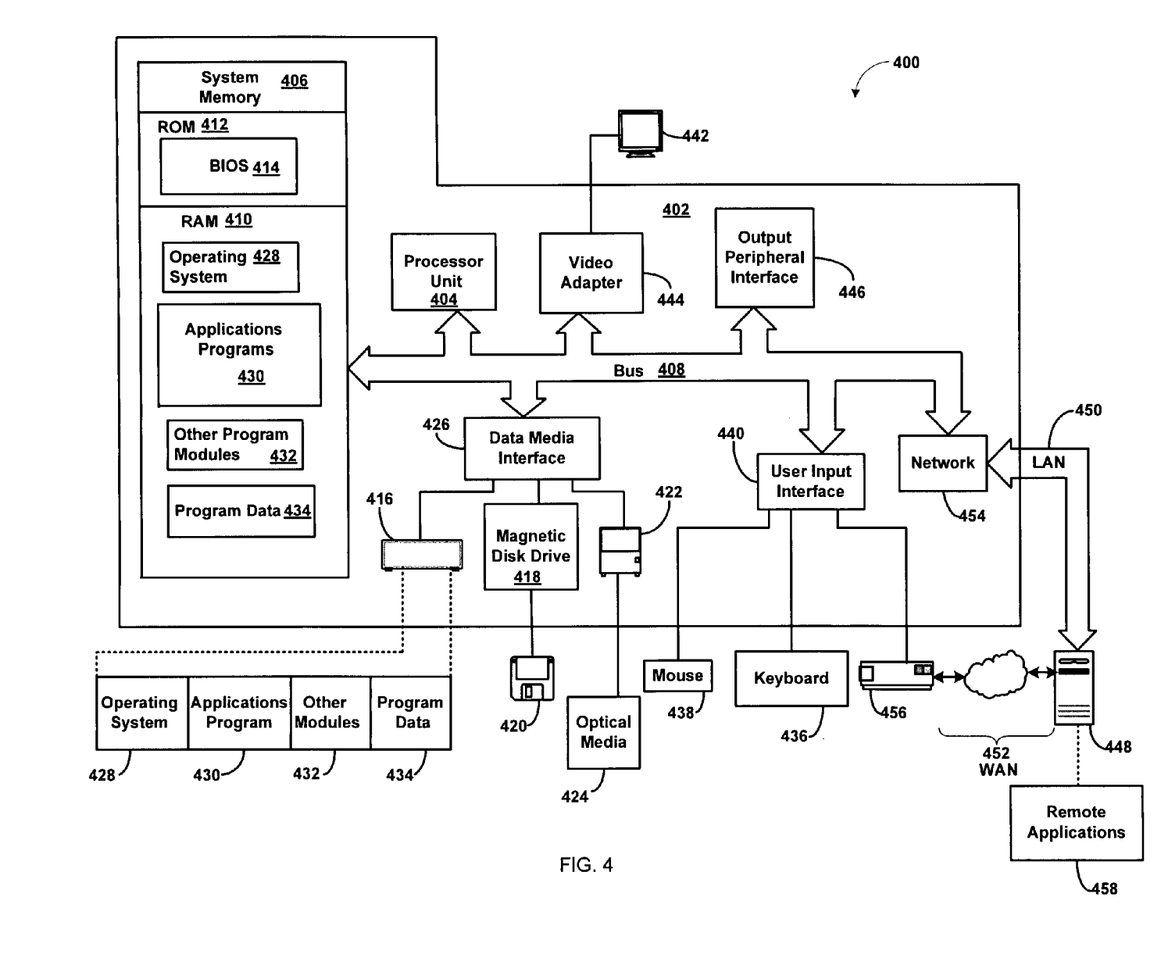
FIG. 4 shows a schematic of an exemplary computing environment in which the integrated circuit mask generation module shown in FIG. 1 may operate.

FIG. 4 shows a schematic of an exemplary computing environment 400 in which the integrated circuit mask generation module 100 shown in FIG. 1 may operate. The exemplary computing environment 400 is only one example of a suitable computing environment and is not intended to suggest any limitation as to the scope of use or functionality of the approach described herein. Neither should the computing environment 400 be interpreted as having any dependency or requirement relating to any one or combination of components illustrated in FIG. 4.

In the computing environment 400 there is a computer 402 which is operational with numerous other general purpose or special purpose computing system environments or configurations. Examples of well known computing systems, environments, and/or configurations that may be suitable for use with an exemplary computer 402 include, but are not limited to, personal computers, server computers, thin clients, thick clients, hand-held or laptop devices, multiprocessor systems, microprocessor-based systems, set top boxes, programmable consumer electronics, network PCs, minicomputers, mainframe computers, distributed computing environments that include any of the above systems or devices, and the like.

The exemplary computer 402 may be described in the general context of computer-executable instructions, such as program modules, being executed by a computer. Generally, program modules include routines, programs, objects, components, logic, data structures, and so on, that performs particular tasks or implements particular abstract data types. The exemplary computer 402 may be practiced in distributed computing environments where tasks are performed by remote processing devices that are linked through a communications network. In a distributed computing environment, program modules may be located in both local and remote computer storage media including memory storage devices.

As shown in FIG. 4, the computer 402 in the computing environment 400 is shown in the form of a general-purpose computing device. The components of computer 402 may include, but are not limited to, one or more processors or processing units 404, a system memory 406, and a bus 408 that couples various system components including the system memory 406 to the processor 404.

Bus 408 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The computer 402 typically includes a variety of computer readable media. Such media may be any available media that is accessible by computer 402, and it includes both volatile and non-volatile media, removable and non-removable media.

In FIG. 4, the system memory 406 includes computer readable media in the form of volatile memory, such as random access memory (RAM) 410, and/or non-volatile memory, such as ROM 412. A BIOS 414 containing the basic routines that help to transfer information between elements within computer 402, such as during start-up, is stored in ROM 412. RAM 410 typically contains data and/or program modules that are immediately accessible to and/or presently operated on by processor 404.

Computer 402 may further include other removable/non-removable, volatile/non-volatile computer storage media. By way of example only, FIG. 4 illustrates a hard disk drive 416 for reading from and writing to a non-removable, non-volatile magnetic media (not shown and typically called a "hard drive"), a magnetic disk drive 418 for reading from and writing to a removable, non-volatile magnetic disk 420 (e.g., a "floppy disk"), and an optical disk drive 422 for reading from or writing to a removable, non-volatile optical disk 424 such as a CD-ROM, DVD-ROM or other optical media. The hard disk drive 416, magnetic disk drive 418, and optical disk drive 422 are each connected to bus 408 by one or more data media interfaces 426.

The drives and their associated computer-readable media provide nonvolatile storage of computer readable instructions, data structures, program modules, and other data for computer 402. Although the exemplary environment described herein employs a hard disk 416, a removable magnetic disk 418 and a removable optical disk 422, it should be appreciated by those skilled in the art that other types of computer readable media which can store data that is accessible by a computer, such as magnetic cassettes, flash memory cards, digital video disks, RAMs, ROM, and the like, may also be used in the exemplary operating environment.

A number of program modules may be stored on the hard disk 416, magnetic disk 420, optical disk 422, ROM 412, or RAM 410, including, by way of example, and not limitation, an operating system 428, one or more application programs 430, other program modules 432, and program data 434. Each of the operating system 428, one or more application programs 430 other program modules 432, and program data 434 or some combination thereof, may include an implementation of the integrated circuit mask generation module 100 shown in FIG. 1.

A user may enter commands and information into computer 402 through optional input devices such as a keyboard 436 and a pointing device 438 (such as a "mouse"). Other input devices (not shown) may include a microphone, joystick, game pad, satellite dish, serial port, scanner, camera, or the like. These and other input devices are connected to the processor unit 404 through a user input interface 440 that is coupled to bus 408, but may be connected by other interface and bus structures, such as a parallel port, game port, or a universal serial bus (USB).

An optional monitor 442 or other type of display device is also connected to bus 408 via an interface, such as a video adapter 444. In addition to the monitor, personal computers typically include other peripheral output devices (not shown), such as speakers and printers, which may be connected through output peripheral interface 446.

Computer 402 may operate in a networked environment using logical connections to one or more remote computers, such as a remote server/computer 448. Remote computer 448 may include many or all of the elements and features described herein relative to computer 402.

Logical connections shown in FIG. 4 are a local area network (LAN) 450 and a general wide area network (WAN) 452. Such networking environments are commonplace in offices, enterprise-wide computer networks, intranets, and the Internet. When used in a LAN networking environment, the computer 402 is connected to LAN 450 via network interface or adapter 454. When used in a WAN networking environment, the computer typically includes a modem 456 or other means for establishing communications over the WAN 452. The modem, which may be internal or external, may be connected to the system bus 408 via the user input interface 440 or other appropriate mechanism.

In a networked environment, program modules depicted relative to the personal computer 402, or portions thereof, may be stored in a remote memory storage device. By way of example, and not limitation, FIG. 4 illustrates remote application programs 458 as residing on a memory device of remote computer 448. It will be appreciated that the network connections shown and described are exemplary and other means of establishing a communications link between the computers may be used.

An implementation of an exemplary computer 402 may be stored on or transmitted across some form of computer readable media. Computer readable media can be any available media that can be accessed by a computer. By way of example, and not limitation, computer readable media may comprise "computer storage media" and "communications media."

"Computer storage media" include volatile and non-volatile, removable and non-removable media implemented in any method or technology for storage of information such as computer readable instructions, data structures, program modules, or other data. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

"Communication media" typically embodies computer readable instructions, data structures, program modules, or other data in a modulated data signal, such as carrier wave or other transport mechanism. Communication media also includes any information delivery media.

The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared, and other wireless media. Combinations of any of the above are also included within the scope of computer readable media.

It is apparent that there has been provided with this disclosure an approach for performing electrically driven optical proximity correction. While the disclosure has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the invention.

What is claimed is:

1. A method, performed on a computing system, for performing an electrically driven optical proximity correction, comprising:

using the computing system to perform the following:

receiving an integrated circuit mask layout representative of a plurality of layered shapes each defined by features and edges;

running a lithography simulation on the mask layout;

extracting an electrical characteristic from the output of the lithography simulation for each layer of the mask layout;

determining whether the extracted electrical characteristic is in conformance with a target electrical characteristic; and adjusting edges of the plurality of layered shapes in the mask layout in response to determining that the extracted electrical characteristic for a layer in the mask layout fails to conform with the target electrical characteristic, wherein the adjusting of the edges of the plurality of layered shapes in the mask layout is adjusted as a function of the difference between the extracted electrical characteristic and the target electrical characteristic, wherein the adjusting of the edges of the plurality of layered shapes in the mask layout is further adjusted as a function of edge placement errors noted between the output of the lithography simulation and the integrated circuit mask layout.

2. The method according to claim 1, wherein the extracted electrical characteristic is selected from the group consisting of current, resistance and capacitance.

3. The method according to claim 1, wherein the extracting of an electrical characteristic is layer dependent.

4. The method according to claim 3, wherein the extracted electrical characteristic comprises current for a polysilicon layer, resistance for a contact layer, resistance and capacitance for a metal layer, current for an active layer and resistance for a via layer.

5. The method according to claim 1, wherein the determining of whether the extracted electrical characteristic is in conformance with the target electrical characteristic comprises ascertaining whether a power or performance calculation associated with the extracted electrical characteristic is within design specification.

6. The method according to claim 1, wherein the adjusting of the edges of the plurality of layered shapes in the mask layout comprises preserving electric fidelity of the mask layout.

7. A computer system for performing an electrically driven optical proximity correction, comprising:
at least one processing unit;
memory operably associated with the at least one processing unit; and
an integrated circuit mask generation module storable in memory and executable by the at least one processing unit, the module comprising:
an input component configured to receive an initial mask layout containing a plurality of layered shapes each defined by features and edges;
a lithography simulation component configured to run a simulation on the initial mask layout; and
an electrically driven optical proximity correction component configured to correct for differences between the initial mask layout and the simulated mask layout, wherein the electrically driven optical proximity correction component comprises an electrical characteristic extraction component configured to extract an electrical characteristic for each layer from the simulated mask layout, an electrical characteristic comparison component configured to determine whether the extracted electrical characteristic is in conformance with a target electrical characteristic and an edge adjustment component configured to adjust edges of the plurality of layered shapes in the initial mask layout in response to determining that the extracted electrical characteristic for a layer fails to conform with the target electrical characteristic, wherein the edge adjustment component is configured to adjust the edges of the plurality of layered shapes in the initial mask layout as a function of the difference between the extracted electrical characteristic and the target electrical characteristic, wherein the edge adjustment component is configured to further adjust the edges of the plurality of layered shapes in the initial mask layout as a function of edge placement errors noted between the simulated mask layout and the initial mask layout.

8. The system according to claim 7, wherein the extracted electrical characteristic is layer dependent.

9. The system according to claim 8, wherein the extracted electrical characteristic comprises current for a polysilicon layer, resistance for a contact layer, resistance and capacitance for a metal layer, current for an active layer and resistance for a via layer.

10. The system according to claim 7, wherein the electrical characteristic comparison component is configured to ascertain whether a power or performance calculation associated with the extracted electrical characteristic is within design specification.

11. A non-transitory computer-readable storage medium storing computer instructions, which when executed, enables a computer system to perform an electrically driven optical proximity correction, the computer instructions comprising:
receiving an integrated circuit mask layout representative of a plurality of layered shapes each defined by features and edges;
running a lithography simulation on the mask layout;
extracting an electrical characteristic from the output of the lithography simulation for each layer of the mask layout;
determining whether the extracted electrical characteristic is in conformance with a target electrical characteristic; and
adjusting edges of the plurality of layered shapes in the mask layout in response to determining that the extracted electrical characteristic for a layer in the mask layout fails to conform with the target electrical characteristic, wherein the adjusting of the edges of the plurality of layered shapes in the mask layout is adjusted as a function of the difference between the extracted electrical characteristic and the target electrical characteristic, wherein the adjusting of the edges of the plurality of layered shapes in the mask layout is further adjusted as a function of edge placement errors noted between the output of the lithography simulation and the integrated circuit mask layout.

12. The computer-readable storage medium according to claim 11, wherein the adjusting of the edges of the plurality of layered shapes in the mask layout comprises instructions for preserving electric fidelity of the mask layout.

13. The computer-readable storage medium according to claim 11, wherein the extracting of an electrical characteristic is layer dependent.

14. The computer-readable storage medium according to claim 11, wherein the determining of whether the extracted electrical characteristic is in conformance with the target electrical characteristic comprises instructions for ascertaining whether a power or performance calculation associated with the extracted electrical characteristic is within specification.

* * * * *